United States Patent
Oki et al.

(10) Patent No.: US 10,672,551 B2
(45) Date of Patent: Jun. 2, 2020

(54) NON-CONTACT POWER FEEDING COIL AND NON-CONTACT POWER FEEDING SYSTEM

(71) Applicant: FUJI CORPORATION, Chiryu-shi (JP)

(72) Inventors: Masayuki Oki, Kosai (JP); Shinji Takikawa, Nagoya (JP); Takeshi Nomura, Chiryu (JP); Takahiro Jindo, Anjo (JP)

(73) Assignee: FUJI CORPORATION, Chiryu-shi (JP)

( * ) Notice: Subject to any disclaimer, the term of this patent is extended or adjusted under 35 U.S.C. 154(b) by 106 days.

(21) Appl. No.: 15/762,397

(22) PCT Filed: Mar. 28, 2016

(86) PCT No.: PCT/JP2016/059941
§ 371 (c)(1),
(2) Date: Mar. 22, 2018

(87) PCT Pub. No.: WO2017/051555
PCT Pub. Date: Mar. 30, 2017

(65) Prior Publication Data
US 2018/0262063 A1    Sep. 13, 2018

(30) Foreign Application Priority Data
Sep. 24, 2015   (WO) .................. PCT/JP2015/076963

(51) Int. Cl.
*H01F 27/28*    (2006.01)
*H01F 27/32*    (2006.01)
(Continued)

(52) U.S. Cl.
CPC .............. *H01F 27/24* (2013.01); *B60L 53/12* (2019.02); *B60L 53/39* (2019.02); *H01F 27/255* (2013.01);
(Continued)

(58) Field of Classification Search
USPC ........................................................ 307/104
See application file for complete search history.

(56) References Cited

U.S. PATENT DOCUMENTS

2008/0129246 A1    6/2008  Morita et al.
2008/0303351 A1*  12/2008  Jansen ................ A61C 1/0015
                                                                307/104
(Continued)

FOREIGN PATENT DOCUMENTS

EP    2 226 819 A1    9/2010
EP    2 879 273 A1    6/2015
(Continued)

OTHER PUBLICATIONS

Partial Supplementary European Search Report dated Sep. 17, 2018 in Patent Application No. 16848346.9.
(Continued)

*Primary Examiner* — Rexford N Barnie
*Assistant Examiner* — Xuan Ly
(74) *Attorney, Agent, or Firm* — Oblon, McClelland, Maier & Neustadt, L.L.P.

(57) ABSTRACT

A power feeding coil that configures a non-contact power feeding system is provided. The power feeding coil is provided with a coil through which an AC current of a specific frequency flows, and a core that forms a section of a circulating magnetic path, which is interlinked with the coil. In the coil, a wire having an insulating covering is wound around a conductor, and a covering thickness of the insulating covering is set so that the influence of a proximity
(Continued)

effect that occurs at the specific frequency between adjacent portions of the wire is a predetermined amount or less. According to this configuration, it is possible to freely adjust a separation distance between portions of the conductor by altering the covering thickness; and the occurrence of AC loss caused by a proximity effect may be appropriately suppressed.

5 Claims, 6 Drawing Sheets

(51) Int. Cl.
*H01F 38/14* (2006.01)
*H02J 50/10* (2016.01)
*H02J 50/40* (2016.01)
*H02J 50/70* (2016.01)
*H01F 27/24* (2006.01)
*H01F 27/255* (2006.01)
*B60L 53/12* (2019.01)
*B60L 53/39* (2019.01)
*H05K 13/00* (2006.01)

(52) U.S. Cl.
CPC ......... *H01F 27/28* (2013.01); *H01F 27/2823* (2013.01); *H01F 27/2871* (2013.01); *H01F 27/32* (2013.01); *H01F 38/14* (2013.01); *H02J 50/10* (2016.02); *H02J 50/40* (2016.02); *H02J 50/70* (2016.02); *H05K 13/00* (2013.01)

(56) References Cited

U.S. PATENT DOCUMENTS

| | | |
|---|---|---|
| 2010/0277004 A1 | 11/2010 | Suzuki et al. |
| 2014/0084697 A1 | 3/2014 | Yasuda et al. |
| 2015/0145630 A1* | 5/2015 | Suzuki ................... H01F 38/14 336/200 |
| 2015/0207332 A1 | 7/2015 | Honda et al. |
| 2016/0020019 A1 | 1/2016 | Kagami et al. |

FOREIGN PATENT DOCUMENTS

| | | | |
|---|---|---|---|
| JP | 2005-108654 | * | 4/2005 |
| JP | 2005-108654 A | | 4/2005 |
| JP | 2006-120239 A | | 5/2008 |
| JP | 2009-158598 A | | 7/2009 |
| JP | 2011-176949 A | | 9/2011 |
| JP | 2011-205783 A | | 10/2011 |
| JP | 2012-204469 A | | 10/2012 |
| JP | 2013-70613 A | | 4/2013 |
| JP | 2014-103147 A | | 6/2014 |
| JP | 2014-176133 A | | 9/2014 |
| JP | 2014-225960 | * | 12/2014 |
| JP | 2014-225960 A | | 12/2014 |
| JP | 2015-128144 A | | 7/2015 |
| WO | WO 2013/150785 A1 | | 10/2013 |

OTHER PUBLICATIONS

International Search Report dated Jun. 21, 2016, in PCT/JP2016/05994 filed Mar. 26, 2016.

* cited by examiner

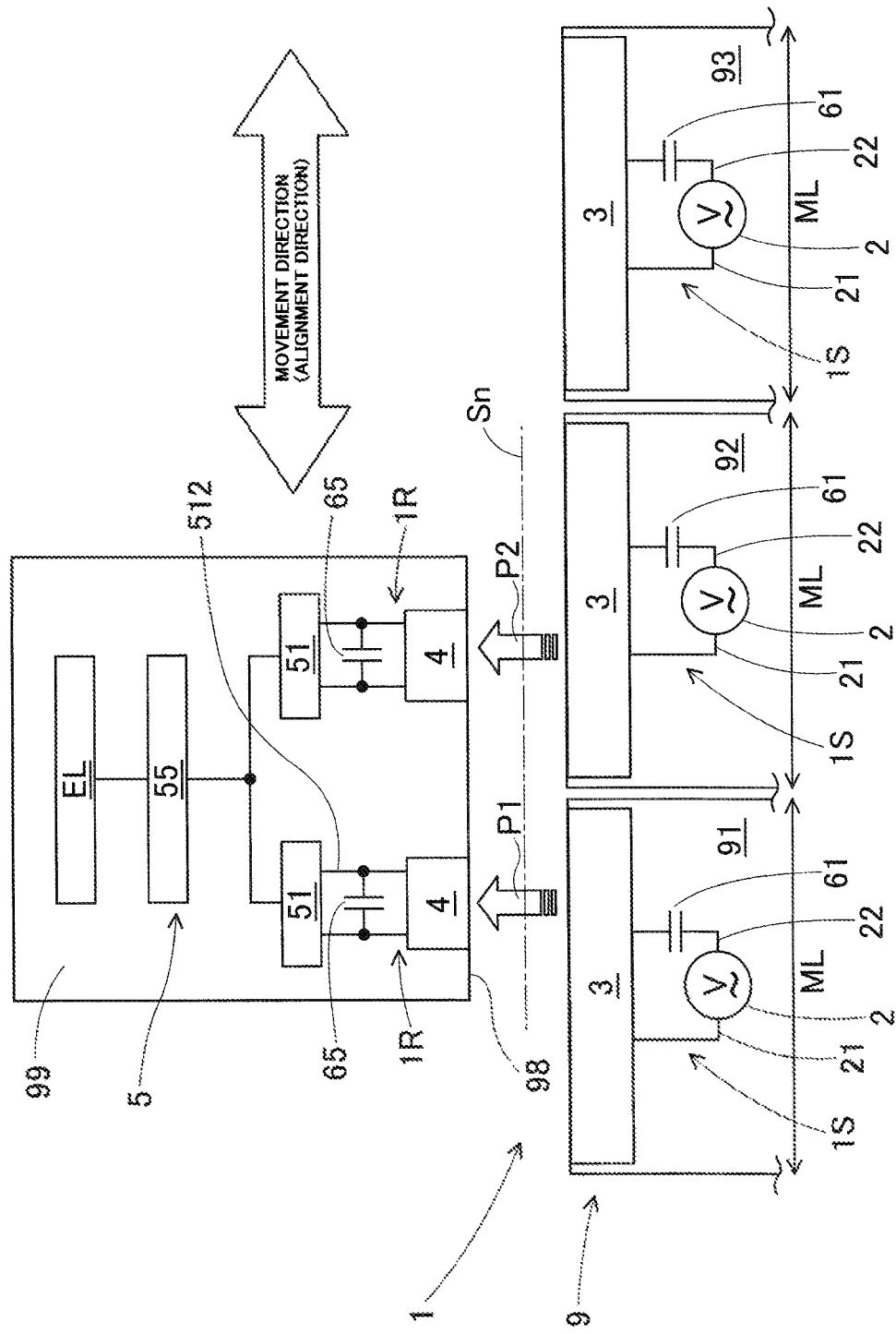

[Fig. 2]
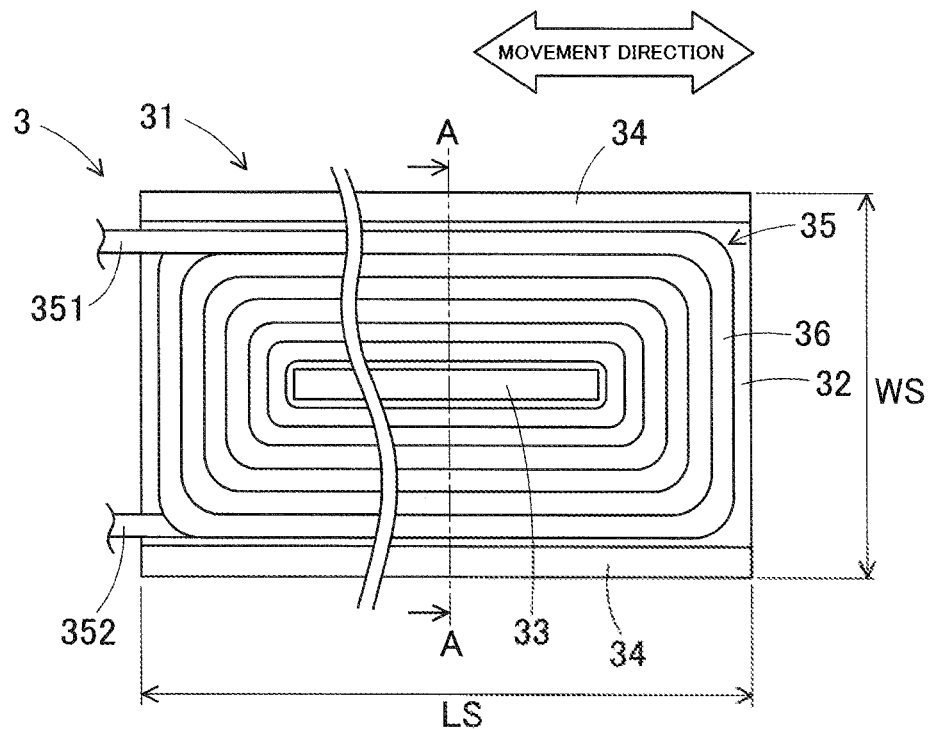
[Fig. 3]
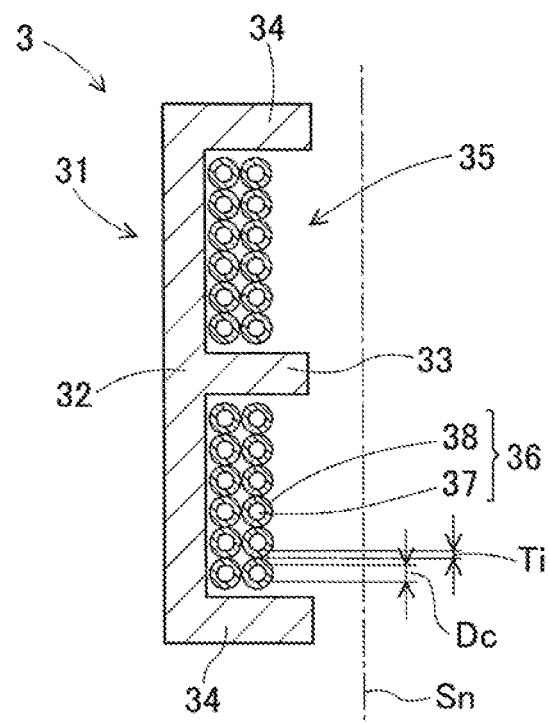

[Fig. 4]
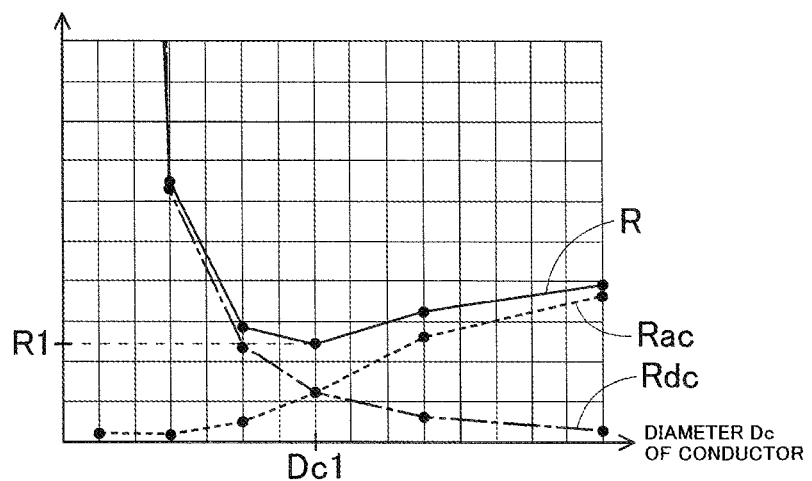
[Fig. 5]
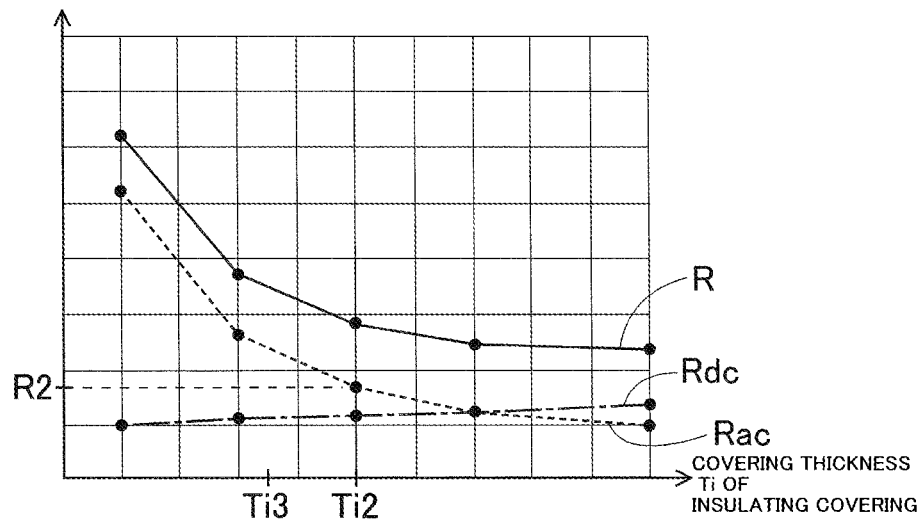

[Fig. 6]
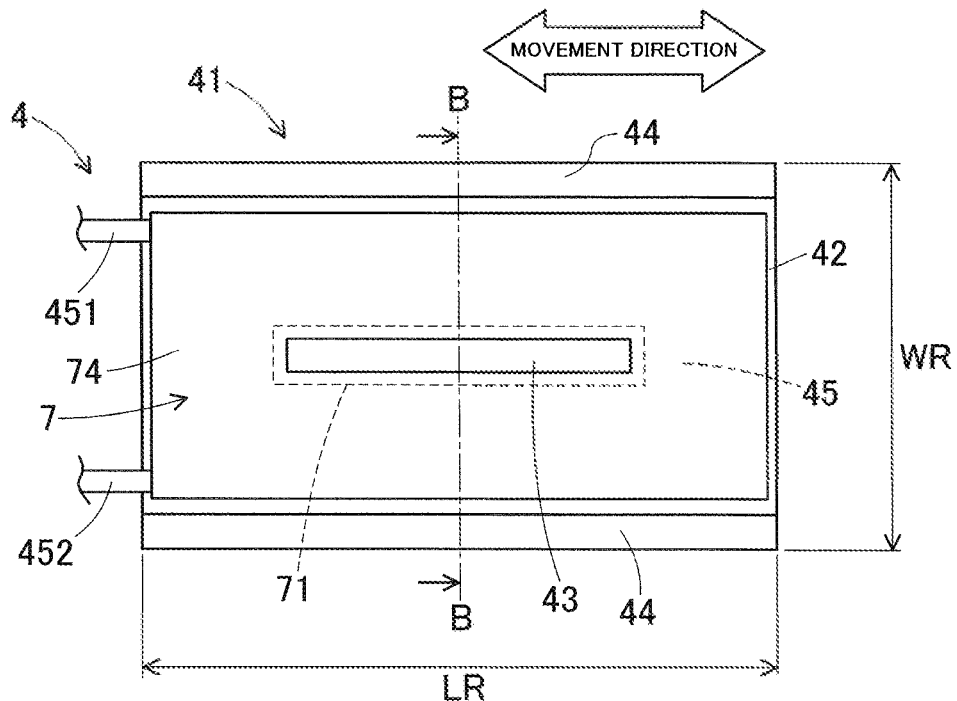
[Fig. 7]
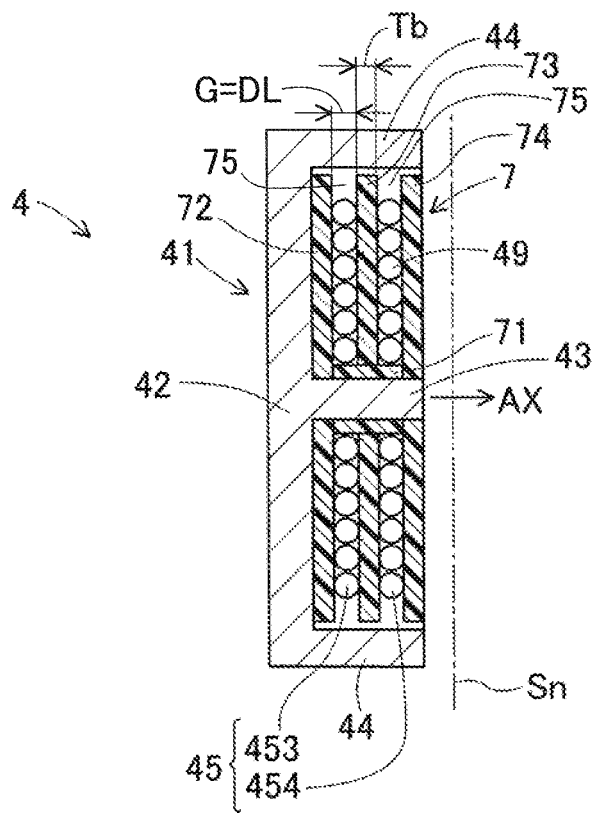

[Fig. 8]
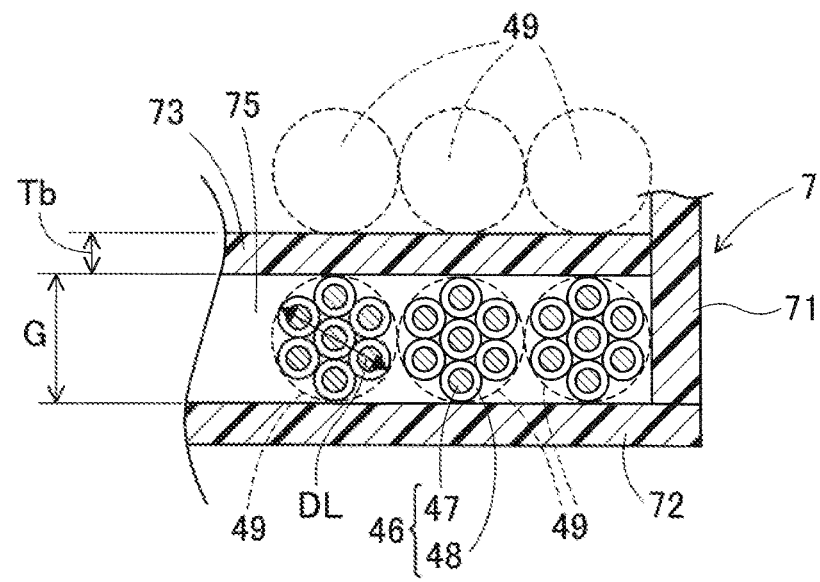
[Fig. 9]
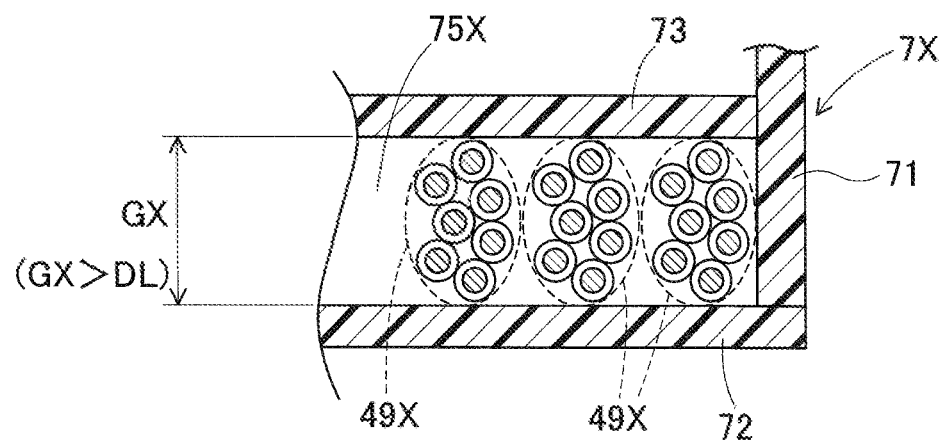

[Fig. 10]
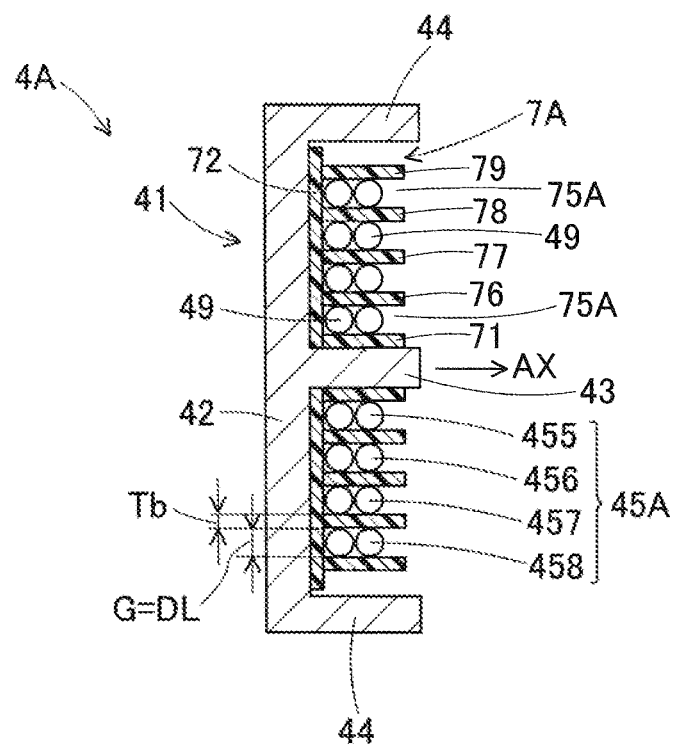

NON-CONTACT POWER FEEDING COIL AND NON-CONTACT POWER FEEDING SYSTEM

TECHNICAL FIELD

The present disclosure relates to a non-contact power feeding coil provided with a coil and a core, and to a non-contact power feeding system configured using the non-contact power feeding system.

BACKGROUND ART

A solder printing machine, an electronic component mounting machine, a ref low machine, aboard inspection machine, and the like, are examples of board production machines that produce boards on which multiple components are mounted. Generally, a board production line is configured by linking such equipment. Furthermore, there are many cases in which a board production line is configured by linearly arranging modularized board production machines of the same size. As a result of the use of modularized board production machines, setup changing work during rearrangement of a line and during expansion for increasing the size of a line is facilitated, and a flexible board production line is realized.

In recent years, the promotion of labor-saving efforts and automation by conveying the equipment, members, and the like, used in each board production machine of a board production line to a moving body, which moves along the board production line, has been examined. Furthermore, non-contact power feeding systems have been considered as power supply means to a moving body. Additionally, applications of non-contact power feeding systems are not limited to board production lines, and are present throughout a broad range of fields such as assembly lines and processing lines that produce other products, and power supply during travel of an electrically driven vehicle. In such a non-contact power feeding system, an electromagnetic coupling technique that respectively uses coils in a power feeding element and a power receiving element is widely used. A technical example relating to an electromagnetic coupling technique non-contact power feeding system is disclosed in PTL 1. Additionally, in the present description, the electromagnetic coupling technique includes an electromagnetic induction technique and an electromagnetic field resonance technique.

The non-contact power transmission device of PTL 1 is provided with coils in a power delivery section (power feeding unit) and a power receiving section (power receiving unit) respectively, performs power delivery and power reception via each coil, converts received AC power into DC power and supplies the DC power to a load. In addition to PTL 1, other electromagnetic coupling technique non-contact power feeding systems are generally configured such that power feeding can be performed across a space by using a significantly higher frequency than a commercial frequency. However, as a result of the frequency being high, loss increases due to AC loss and leakage flux of a coil, and therefore, there is a tendency for power feeding efficiency to decrease.

The AC loss is generated by an eddy current in the coil, and increases as the frequency increases. AC loss includes AC loss caused by a skin effect that is generated in a single conductor and AC loss caused by a proximity effect that is generated between multiple conductors. In addition, since an electric current flows into and heat is generated in peripheral metal objects to which leakage flux reaches, an increase in loss is caused. Various technical examples of non-contact power feeding coils in which an increase in loss is suppressed are disclosed in PTL 2 to 4.

PTL 2 discloses a planar coil composed of a coiled wire section that is used in a power delivery coil (power feeding coil) or a coil for power reception (power receiving coil) of a non-contact power transmission machine. The planar coil is characterized by a gap for suppressing eddy currents being provided between wire sections. According to this configuration, adjacent wire sections mutually influence one another, the generation of an eddy current is suppressed (suppression of a proximity effect), and heat generation of the planar coil is reduced.

PTL 3 discloses a power feeding section provided with a power supply, a power feeding-side resonance coil, and a conductive shielding case in which the coil is accommodated. The power feeding section is further provided with a magnetic body that is disposed outside the shielding case. According to this configuration, among the magnetic field emitted by the power feeding-side resonance coil, since magnetic field leakage leaked from the shielding case is absorbed by the magnetic body (ferrite), it is possible to sufficiently prevent electromagnetic leakage.

PTL 4 discloses a non-contact power feeding coil provided with a coil main body around which a wire is wound, said core main body having an H-shaped core, a case main body in which the coil main body is accommodated, the case main body being made from a resin, and a non-magnetic conductive plate for magnetic shielding to which the case main body is fixed. The non-contact power feeding coil device for non-contact power feeding is disposed on a rear face of the non-magnetic conductive plate in a housing in which a resonance capacitor and a rectifier circuit are accommodated. Furthermore, the embodiments describe a litz wire as a countermeasure for reducing loss. According to this configuration, it is possible to configure the device in a compact manner by using a short wiring line, and therefore, a reduction in power feeding efficiency is moderated without losing a magnetic shielding effect.

CITATION LIST

Patent Literature

PTL 1: JP-A 2011-205783
PTL 2: JP-A 2009-158598
PTL 3: JP-A 2014-176133
PTL 4: JP-A 2012-204469

SUMMARY

It should be noted that in the manufacturing method of the planar coil described in the embodiments of PTL 2, the wire sections are laid on a sheet using a dedicated wire-laying device in order to ensure a gap between wire sections. In addition to this, a method that performs winding work for forming a coil while inserting a spacer between wire sections can also be considered. However, even if such ideas are adopted, manufacture of a planar coil is not easy, and an increase in AC loss due to a reduction in dimensional accuracy and an increase in work man-hours required for manufacturing are considered to be difficulties.

In addition, in the technical example of PTL 3, even if it is possible to prevent electromagnetic leakage to outside the magnetic body, leakage flux enters the shielding case on the inner side of the magnetic body. Accordingly, eddy current loss is generated in the shielding case and there is an increase in loss. In addition, the litz wire disclosed in PTL 4 is expensive compared to a wire composed of a single conductor, but it is possible to significantly reduce AC loss caused by a skin effect. However, there is a concern that shape loss will occur in the cross-sectional shape of the litz wire during winding work, and that the effect of reducing AC loss will be lost.

In the above-mentioned manner, when loss of a power feeding coil and a power receiving coil is increased, naturally, the power feeding efficiency of the non-contact power feeding system decreases.

The present disclosure has been devised in the light of the above-mentioned problems of the background art, and addresses a problem of providing a non-contact power feeding coil in which the occurrence of AC loss is suppressed, and providing a non-contact power feeding system in which favorable power feeding efficiency can be obtained by using the non-contact power feeding coil.

The present disclosure that solves the above-mentioned problems is to provide a non-contact power feeding coil. The non-contact power feeding coil that is used in at least one of a power feeding coil and a power receiving coil that configure a non-contact power feeding system is provided with a coil through which an AC current of a specific frequency flows, and a core that forms a section of a circulating magnetic path, which is interlinked with the coil, in the coil, a wire having an insulating covering is wound around a conductor, and a covering thickness of the insulating covering is set so that the influence of a proximity effect that occurs at the specific frequency between adjacent portions of the wire is a predetermined amount or less.

In addition, a non-contact power feeding system of the present disclosure is provided with a power feeding coil provided in a power feeding unit, an AC power supply circuit that supplies AC power of the specific frequency to the power feeding coil, a power receiving coil that is provided in a power receiving unit, the power receiving coil electrically coupling with and receiving AC power in a non-contact manner when opposing the power feeding coil, and a power receiving circuit that converts AC power received by the power receiving coil, generates a drive voltage, and outputs the drive voltage to an electrical load, the power feeding coil is the above-mentioned non-contact power feeding coil of the present disclosure, and the power receiving coil includes a coil through which an AC current of the specific frequency flows and a core that forms a section of a circulating magnetic path, which is interlinked with the coil, the coil is composed of a plurality of coil blocks in which a wires having insulating coverings around conductors are respectively wound, and further includes a bobbin having a main partition section that partitions the coil and the core, and an inter-block partition section that partitions the plurality of coil blocks.

In the non-contact power feeding coil of the present disclosure, the occurrence of AC loss caused by a proximity effect is suppressed.

In the non-contact power feeding system of the present disclosure, favorable power feeding efficiency can be obtained.

BRIEF DESCRIPTION OF DRAWINGS

FIG. 1 is a view that schematically describes an entire configuration of a non-contact power feeding system of an embodiment.

FIG. 2 is a front view of a power feeding coil of the embodiment.

FIG. 3 is a cross-sectional view of the power feeding coil when an A-A cross-section shown by the dashed-dotted line in FIG. 2 is viewed from the direction of the arrows.

FIG. 4 is a view that shows a result obtained by calculating the relationship between the diameter of a conductor and the resistance values of a coil by using a simulation with the power feeding coil as a subject.

FIG. 5 is a view that shows a result obtained by calculating the relationship between the covering thickness of an insulating covering and the resistance values of the coil by using a simulation with the power feeding coil as a subject.

FIG. 6 is a front view of a power receiving coil of the embodiment.

FIG. 7 is a cross-sectional view of the power receiving coil when a B-B cross-section shown by the dashed-dotted line in FIG. 6 is viewed from the direction of the arrows.

FIG. 8 is a partial cross-sectional view that schematically shows a litz wire and a coil accommodation space that are used in the power receiving coil.

FIG. 9 is a partial cross-sectional view that describes a case in which shape loss occurs in the litz wire as an illustrative example.

FIG. 10 is a cross-sectional view of a power receiving coil of another embodiment.

DETAILED DESCRIPTION

1. Entire Configuration of Non-Contact Power Feeding System 1 of Embodiment

A non-contact power feeding system 1 of an embodiment of the present disclosure will be described below with reference to FIG. 1. FIG. 1 is a view that schematically describes an entire configuration of the non-contact power feeding system 1 of the embodiment. The non-contact power feeding system 1 of the embodiment can be applied to a board production line 9. As illustrated in the drawings, the board production line 9 is configured by three first to third board production machines 91 to 93 being linearly arranged. The left-right direction in FIG. 1 is a linear arrangement direction of the first to third board production machines 91 to 93, and is also a movement direction of a moving body 99, which will be mentioned later.

Each board production machine 91 to 93 is modularized, and width dimensions ML in the linear arrangement direction thereof are equivalent. The first to third board production machines 91 to 93 are configured so that alterations in the order of the linear arrangement positions and replacements with other modularized board production machines can be made. The number of linearly arranged board production machines that configure the board production line 9 may be four or more, and the board production line 9 is also compatible with module expansion for increasing the number of linearly arranged machines. In other words, during alteration or of the order of or increase of the board production machines, a moving body 99 can move along the linearly arranged board production machines without performing wiring of cables, or the like, for performing power feeding in a non-contact manner. Electronic component mounting machines can be included as illustrative examples of the first to third board production machines 91 to 93, but the disclosure is not limited to this configuration.

A guide rail, which extends in the linear arrangement direction but is not illustrated in the drawings, is installed in front of the first to third board production machines 91 to 93. The moving body 99 moves in the movement direction (the linear arrangement direction of the first to third board production machines 91 to 93) along the guide rail. The moving body 99 has roles of carrying in equipment, members, and the like, that are used by each board production machine 91 to 93 from a storage container, which is not illustrated in the drawings, and returning equipment, members, and the like, to the storage container after use.

The non-contact power feeding system 1 of the embodiment is a system that performs non-contact power feeding from the first to third board production machines 91 to 93 with the moving body 99 as a power feeding target by using an electromagnetic coupling technique. The non-contact power feeding system 1 is configured from power feeding units LS respectively provided on the front side of each board production machine 91 to 93, and two power receiving units 1R provided in the moving body 99.

The power feeding units 1S are configured by an AC power supply circuit 2, a power feeding coil 3, and the like. The AC power supply circuit 2 supplies AC power of a specific frequency to the power feeding coil 3. For example, the AC power supply circuit 2 can be configured using a DC power supply section that supplies a DC voltage, and a publicly-known bridge circuit that AC converts the DC voltage. A first output terminal 21 of the AC power supply circuit 2 is directly coupled with one end of the power feeding coil 3, and a second output terminal 22 is connected to one end of a power feeding-side capacitor 61. The specific frequency of the AC power supply circuit 2 is set on the basis of resonance frequencies of a power feeding-side resonance circuit and a power receiving-side resonance circuit, which will be mentioned later. Frequencies of the order of a few tens of kHz to a few hundred kHz can be included as illustrative examples of the specific frequency, but the disclosure is not limited to this configuration. The AC power supply circuit 2 includes a function of adjusting voltage value, and the like.

The total of three AC power supply circuits 2 provided in the three board production machines 91 to 93 can be operated independently of one another. Each board production machine 91 to 93 has a sensor which detects proximity of the moving body 99 but is not illustrated in the drawings. Further, the AC power supply circuit 2 of each board production machine 91 to 93 operates only when the moving body 99 comes into proximity therewith. As a result of this, at times when the moving body 99 is separated far away, the AC power supply circuit 2 is stopped, and unnecessary electrical loss does not occur.

The power feeding coils 3 are provided on the front face of each board production machine 91 to 93, and are formed to have a symmetric shape at the front and back in a conveyance direction. The power feeding-side capacitor 61 is a resonance element that forms the power feeding-side resonance circuit by being connected in series to the power feeding coil 3. The other end of the power feeding-side capacitor 61 is connected to the other end of the power feeding coil 3. As a result of this, an annular power feeding circuit is configured. Accordingly, an AC current of the specific frequency flows in the power feeding coil 3.

Meanwhile, the power receiving units 1S are configured by a power receiving coil 4, a power receiving circuit 5, and the like. The two power receiving coils 4 are installed, in the moving body 99, on a side face 98 that opposes the power feeding coils 3, and are disposed spatially separated from one another in the movement direction. When The power feeding coils 3 and the power receiving coils 4 are disposed with an opposing intermediate face Sn interposed therebetween, cores 31 and 41, which will be mentioned later, jointly form a circulating magnetic path and electromagnetically couple. As a result of this, mutual inductance occurs between the power feeding coils 3 and the power receiving coils 4 and non-contact power feeding is possible. Accordingly, an AC current of the specific frequency also flows through the power receiving coils 4. The actual separation distance between the power feeding coils 3 and the power receiving coils 4 is smaller than the illustrated separation distance shown.

One end of each power receiving coil 4 is connected to one end of a power receiving-side capacitor 65 and one terminal on an input side of a rectifier circuit 51 that configures the power receiving circuit 5. The other end of the power receiving coil 4 is connected to the other end of the power receiving-side capacitor 65 and the other terminal on the input side of the rectifier circuit 51. The power receiving-side capacitor 65 is a resonance element that forms a power receiving-side resonance circuit by being connected in parallel to the power receiving coil 4.

The power receiving circuit 5 converts the AC power received by the power receiving coil 4 and generates a drive voltage. The power receiving circuit 5 is configured to include the rectifier circuits 51, which are provided for each power receiving coil 4, and a DC power supply circuit 55, which is provided commonly to the two rectifier circuits 51. Each rectifier circuit 51 is configured by a full-wave rectifier, which is bridge connected to four rectifier diodes, and a smoothing capacitor, which is connected to the output side of the full-wave rectifier circuit. The two rectifier circuits 51 convert the AC power received by the power receiving coils 4 into a DC voltage and output the DC voltage. The output sides of the two rectifier circuits 51 are connected in parallel to the DC power supply circuit 55.

The DC power supply circuit 55 converts the DC voltage into a drive voltage, and outputs the drive voltage to an electrical load EL mounted in the moving body 99. The DC power supply circuit 55 has a stabilization action of the drive voltage. In other words, the DC power supply circuit 55 adjusts DC voltages having an unstable voltage values, which are output from the rectifier circuits 51, to a drive voltage having a largely fixed voltage, and outputs the drive voltage to the electrical load EL. A switching system or dropper system DC-DC converter are illustrative examples of the DC power supply circuit 55. The DC power supply circuit 55 is provided with a step-down function and may be further provided with a step-up function.

The electrical load EL performs work in the moving body 99, the type, power consumption, and the like, thereof are not limited. For example, the electrical load EL may include a driving source for movement of the moving body 99, for example, a stepping motor, a servomotor, or the like.

In this instance, the lengths of the power feeding coils 3 and the power receiving coils 4 in the movement direction, and the mutual adjacent separation distances in the movement direction are set so that non-contact power feeding is performed stably. In other words, a power feeding coil 3 and at least one power receiving coil 4 are in a directly facing state at all times regardless of the position of the moving body 99. A directly facing state refers to a state in which the entire length of a power receiving coil 4 in the movement direction opposes a range of the length of a power feeding coil 3 in the movement direction.

In the positional relationship illustrated by way of example in FIG. 1, the power feeding coil 3 of the first board production machine 91 and the power receiving coil 4 on the left side in the drawing directly face one another, and the power feeding coil 3 of the second board production machine 92 and the power receiving coil 4 on the right side in the drawing directly face one another. At this time, the two power receiving coils 4 are both in favorable power receiving states, and as shown by the arrows P1 and P2, it is possible to receive a large amount of AC power. A power receiving coil 4 in a directly facing state has a power reception capacity corresponding to an amount capable of driving the electrical load EL individually. Accordingly, a battery and a charging circuit are not required in the non-contact power feeding system 1.

2. Detailed Configuration of Power Feeding Coil 3 of Embodiment

Next, a detailed configuration of the power feeding coil 3 of the embodiment will be described. The power feeding coil 3 is equivalent to an embodiment of a non-contact power feeding coil of the present disclosure. FIG. 2 is a front view of the power feeding coil 3 of the embodiment. The left-right direction in FIG. 2 corresponds to the movement direction of the moving body 99. FIG. 3 is a cross-sectional view of the power feeding coil 3 when an A-A cross-section shown by the dashed-dotted line in FIG. 2 is viewed from the direction of the arrows. The power feeding coil 3 is provided with the core 31 and a coil 35.

As shown by FIG. 3, the core 31 is an E-type core having a cross-section that is E-shaped, and is composed of a bottom face section 32, a center leg section 33, and two side leg sections 34. The bottom face section 32 is formed in a rectangular plate form. The two side leg sections 34, on which the coil 35 is not installed, are erected from the two long sides of the bottom face section 32, and are parallel to one another. The center leg section 33, on which the coil 35 is installed, is erected from the center of the bottom face section 32. The center leg section 33 is parallel to the two side leg sections 34, and the length thereof in the movement direction is less than those of the side leg sections 34. The height dimensions to which the center leg section 33 and the side leg sections 34 are erected are mutually equivalent. For example, the core 31 can be formed as an integral product by sintering a magnetic powder, or stacking electromagnetic steel sheets.

The coil 35 is disposed around the center leg section 33. The coil 35 is formed by winding a wire 36 around a coil mold whose shape is equivalent to the shape of the center leg section 33. The wire 36 has an insulating covering 38 around a conductor 37. The conductor 37 is a single conductor composed of a single wire having a circular cross-section with a diameter Dc, and is configured from a copper wire, an aluminum wire, or the like. The disclosure is not limited to this configuration, and the conductor 37 may be rectangular with a chamfered cross-section, or the like, may be a composite conductor composed of a plurality of wires, or may be a material other than copper or aluminum. The insulating covering 38 is configured from a resin, or the like, and the covering thickness on one side thereof is Ti.

In the coil 35, the wire 36 is wound around, in a parallel manner, an opposing intermediate face Sn when a power feeding coil 3 and a power receiving coil 4 oppose one another. In the present embodiment, the coil 35 is configured by 12 turns in total, including 6 turns in each of two layers. The number of layers of the coil 35 and the number of turns per layer can be altered as appropriate. As shown by FIG. 2, both ends 351 and 352 of the coil 35 are lead out in the short side direction of the bottom face section 32 of the core 31.

In this instance, the cross-sectional area of the conductor 37, or in other words, the diameter Dc of the circular cross-section is set on the basis of a coil resistance value R. The coil resistance value R is calculated by adding a DC resistance value Rdc of the coil 35, to an AC resistance value Rac of the coil 35, which is a resistance increment caused by a skin effect that occurs at the specific frequency. FIG. 4 is a view that shows a result obtained by calculating the relationship between the diameter Dc of the conductor 37 and the resistance values R, Rdc, and Rac of the coil 35 by using a simulation with the power feeding coil 3 as a subject. In the simulation, the respective resistance values R, Rdc, and Rac are calculated at six diameters Dc while the covering thickness Ti of the insulating covering 38 is kept constant. In FIG. 4, the coil resistance value R is shown by using a solid line, the DC resistance value Rdc by using a dashed-dotted line, and the AC resistance value Rac by using a broken line.

As illustrated in the drawing, the DC resistance value Rdc decreases as the diameter Dc increases in an inversely proportionate manner to the square of the diameter Dc. Meanwhile, since the influence of a skin effect becomes more significant as the diameter Dc increases, the AC resistance value Rac shows an increasing trend. Further, the coil resistance value R, which is obtained by adding the DC resistance value Rdc and the AC resistance value Rac, corresponds to the smallest possible value R1 at a diameter Dc1. In other words, there is an adverse effect on the loss of the power feeding coil 3 regardless of whether the diameter Dc of the conductor 37 is decrease or increased from the diameter Dc1. Therefore, the diameter Dc of the conductor 37 is set on the basis of the diameter Dc1. The workability during winding work, the mechanical strength when a fault current flows, and the like, can be considered as other factors for setting the material, cross-sectional shape, and cross-sectional area (diameter Dc in a case of a circular cross-section) of the conductor 37.

Additionally, the size of the DC resistance value Rdc is not dependent on the specific frequency, but the size of the AC resistance value Rac is dependent on the specific frequency. Therefore, when the specific frequency is altered, the diameter Dc1 may change.

In addition, the covering thickness Ti of the insulating covering 38 is set so that the influence of a proximity effect that occurs at the specific frequency between adjacent portions of the wire 36 corresponds to a predetermined amount or less. FIG. 5 is a view that shows a result obtained by calculating the relationship between the covering thickness Ti of the insulating covering 38 and the resistance values R, Rdc, and Rac of the coil 35 by using a simulation with the power feeding coil 3 as a subject. In the simulation, the respective resistance values R, Rdc, and Rac are calculated at five covering thicknesses Ti while the diameter Dc of the conductor 37 is kept constant. In FIG. 5, the DC resistance value Rdc is shown by using a solid line, the DC resistance value Rdc by using a dashed-dotted line, and the AC resistance value Rac by using a broken line.

As illustrated in the drawing, the DC resistance value Rdc increases with an extremely shallow slope as the covering thickness Ti increases. Meanwhile, since the influence of a proximity effect is reduced as the covering thickness Ti increases, the AC resistance value Rac shows a decreasing trend. In this instance, the condition of the influence of a proximity effect corresponding to a predetermined amount or less can be replaced with a condition of the AC resistance value Rac corresponding to a predetermined resistance value R2 or less. According to this configuration, the covering thickness Ti of the insulating covering 38 corresponds to a covering thickness Ti2 or less, at which the AC resistance value Rac corresponds to the resistance value R2. In addition, generally, it is necessary for the covering thickness Ti to be set to a covering thickness Ti3 at which it is possible to ensure insulating performance between portions of the conductor 37. Accordingly, the covering thickness Ti of the insulating covering 38 is set to be the higher of the covering thickness Ti2 and the covering thickness Ti3.

By combining and implementing the two simulations described using FIGS. 4 and 5, it is possible to optimize the diameter Dc of the conductor 37 of the wire 36 and the covering thickness Ti of the insulating covering 38. As a result of this, in the power feeding coil 3, the occurrence of AC loss caused by a skin effect and a proximity effect is suppressed.

In a manufacturing step of the power feeding coil 3, the core 31 and the coil 35 are formed separately, and are subsequently joined in an integral manner. As a result of joining in an integral manner, the center leg section 33 of the core 31 is fitted into a hollow section at the center of the coil 35. The side leg sections 34 of the core 31 cover, among an outer peripheral section of the coil 35, a partial range that is parallel to the movement direction of the moving body 99. The core 31 is not covered in, among the outer peripheral section of the coil 35, the remaining range that intersects the movement direction. The bottom face section 32 of the core 31 covers an end face section on a side that is separated from the opposing intermediate face Sn of the coil 35. As a result of this, a magnetic shielding effect that suppresses leakage to the outside of a magnetic flux emitted from the power feeding coil 3 occurs. Accordingly, in the power feeding coil 3, loss due to leakage flux is reduced.

In addition, as shown in FIG. 1, a plurality of the power feeding coils 3 are used aligned in the movement direction of the moving body 99. Therefore, between power feeding coils 3, the majority of magnetic flux leakage is directed toward a neighboring power feeding coil 3, and an extremely small part of leakage flux leaks to the outside. In other words, among the outer peripheral section of the coil 35, the necessity for magnetic shielding in the remaining range is low. Accordingly, even if the side leg sections are not provided to the two short sides of the bottom face section 32, a sufficient magnetic shielding effect is obtained. As a result of this, the shape of the core 31 is simplified, and effects of reductions in weight and cost are achieved. Additionally, when the side leg sections are provided to the two short sides of the bottom face section 32, there is an adverse effect of no longer being able to from a favorable circulating magnetic path when a power receiving coil 4 is initially shifted from a directly facing positional relationship relative to a power feeding coil 3.

3. Detailed Configuration of Power Receiving Coil 4 of Embodiment

Next, a detailed configuration of the power receiving coil 4 of the embodiment will be described. FIG. 6 is a front view of the power receiving coil 4 of the embodiment. The left-right direction in FIG. 6 corresponds to the movement direction of the moving body 99. FIG. 7 is a cross-sectional view of the power receiving coil 4 when a B-B cross-section shown by the dashed-dotted line in FIG. 6 is viewed from the direction of the arrows. The power receiving coil 4 is provided with a core 41, a coil 45 and a bobbin 7.

As shown by FIG. 7, the core 41 is an E-type core having a cross-section that is E-shaped, and is composed of a bottom face section 42, a center leg section 43, and two side leg sections 44. The bottom face section 42 is formed in a rectangular plate form. The two side leg sections 44, on which the coil 45 is not installed, are erected from the two long sides of the bottom face section 42, and are parallel to one another. The center leg section 43, on which the coil 45 is installed, is erected from the center of the bottom face section 42. The center leg section 43 is parallel to the two side leg sections 44, and the length thereof in the movement direction is less than those of the side leg sections 44. The direction in which the center leg section 43 is erected corresponds to an axis line AX-direction that is perpendicular to the opposing intermediate face Sn. The height dimensions to which the center leg section 43 and the side leg sections 44 are erected are mutually equivalent. For example, the core 41 can be formed as an integral product by sintering a magnetic powder, or stacking electromagnetic steel sheets.

Relating to the movement direction of the moving body 99, a length dimension LR of the core 41 of the power receiving coil 4 is shorter than a length dimension LS (refer to FIG. 2) of the core 31 of the power feeding coil 3. Meanwhile, a width dimension WR of the core 41 of the power receiving coil 4 is substantially equivalent to a width dimension WS (refer to FIG. 2) of the core 31 of the power feeding coil 3. Accordingly, when a power feeding coil 3 directly faces a power receiving coil 4, the center leg sections 33 and 43, and the two side leg sections 34 and 44 oppose one another, and a circulating magnetic path is formed. In addition, the directly facing positional relationship is retained until the moving body 99 has moved a given amount.

As shown in FIG. 7, the bobbin 7 is composed of a center leg main partition section 71, a bottom face main partition section 72, an inter-inter-block partition section 73, and a block end partition section 74. The center leg main partition section 71 is a rectangular tubular shape that orbits the center leg section 43 of the core 41. The bottom face main partition section 72, the inter-block partition section 73, and the block end partition section 74 are respectively annular plate-like sites, and are disposed in a mutually parallel manner in contact with the periphery of the center leg main partition section 71. The bottom face main partition section 72 is disposed in contact with the bottom face section 42 of the core 41. The block end partition section 74 is disposed to match the end surfaces of the center leg section 43 and the side leg sections 44 of the core 41. The inter-block partition section 73 is disposed in the middle of the bottom face main partition section 72 and the block end partition section 74.

Coil accommodation spaces 75 in which a gap dimension in the axis line AX-direction is G, are respectively defined between the bottom face main partition section 72 and the inter-block partition section 73, and between the inter-block partition section 73 and the block end partition section 74. The coil accommodation spaces 75 correspond to annular empty spaces that are shallow in the axis line AX-direction. The bobbin 7 has a solid coil mold function around which the coil is wound and formed, and has a function of ensuring insulating performance between the core 41 and the coil 45. For example, the bobbin 7 can be formed as an integral product by using a method such as joining of multiple resin members, cast resin molding, or the like.

As shown in FIG. 7, the coil 45 is composed of two annular plate-shaped coil blocks 453 and 454. The two annular plate-shaped coil blocks 453 and 454 are accommodated in the respective coil accommodation spaces 75, and are aligned separated from one another in the axial line direction AX. The annular plate-shaped coil blocks 453 and 454 are formed by winding a litz wire 49 around the axis line AX direction six turns in the radial direction. Additionally, the number of winding turns of the litz wire 49 is not limited to six turns. In addition, in place of the litz wire 49, a wire having an insulating covering around a single conductor may be used. In the present embodiment, the two annular plate-shaped coil blocks 453 and 454 are electrically connected in series, but may be connected in parallel.

FIG. 8 is a partial cross-sectional view that schematically shows the litz wire 49 and a coil accommodation space 75 that are used in the power receiving coil 4. The litz wire 49 is configured be seven wires 46 being twisted together, but may also have another configuration. As shown by the broken line, the cross-sectional shape of the litz wire 49 is equivalent to being circular, and an equivalent outer diameter dimension thereof is DL. The wire 46 has an insulating covering 48 around a conductor 47. The conductor 47 is configured to be a copper wire or an aluminum wire having a circular cross-section. For example, the insulating covering 48 is configured to be a formal resin. The litz wire 49 can significantly decrease the influence of a skin effect in comparison with a single wire having a large diameter, and has an effect of decreasing AC loss of the power receiving coil 4.

In the coil 45, the litz wire 49 is wound around, in a parallel manner, the opposing intermediate face Sn when a power feeding coil 3 and a power receiving coil 4 oppose one another. As shown by FIG. 6, both ends 451 and 452 of the coil 45 are lead out in the short side direction of the bottom face section 42 of the core 41.

In this instance, the gap dimension G of the two coil accommodation spaces 75 is set so as to be equivalent to the equivalent outer diameter dimension DL of the litz wire 49. Therefore, in winding work for forming the power receiving coil 4, shape loss of the cross-sectional shape of the litz wire 49 does not occur. Accordingly, in the power receiving coil 4, in comparison with the use of a single wire having a large diameter, a decreasing effect on AC loss is significant when the litz wire 49 is used.

The state shown in FIG. 9 occurs in a case in which the gap dimension G of the coil accommodation spaces 75 is set to be larger than the equivalent outer diameter dimension DL of the litz wire 49. FIG. 9 is a partial cross-sectional view that describes a case in which shape loss occurs in the litz wire 49X as an illustrative example. In a case in which a gap dimension GX of coil accommodation spaces 75X of a bobbin 7X is larger than the equivalent outer diameter dimension DL, shape loss occurs in the circular cross-sectional shape of a litz wire 49X due to forces applied during coil work. As a result of this, there is a concern that the decreasing effect on AC loss will be lost when the litz wire 49X is used.

In addition, even if the gap dimension G of the coil accommodation spaces 75 is made to be smaller than the equivalent outer diameter dimension DL of the litz wire 49, shape loss occurs in the circular cross-sectional shape of the litz wire 49. Moreover, since the litz wire 49 is forcibly inserted into the narrow coil accommodation spaces 75, there is a concern that the insulating covering 48 will be damaged.

In addition, the covering thickness Tb of the inter-block partition section 73 is set so that the influence of a proximity effect that occurs at the specific frequency between portions of the litz wire 49 with the inter-block partition section 73 interposed therebetween corresponds to a predetermined amount or less. The influence of a proximity effect is decreased by increasing the thickness Tb. However, increasing the thickness Tb is directly linked with increases in the size, weight, cost, and the like, of the power receiving coil 4. Accordingly, these disadvantages are also taken into consideration in a comprehensive manner, and the thickness Tb of the inter-block partition section 73 is set as an optimum value. As a result of this, in the power receiving coil 4, the occurrence of AC loss caused by a proximity effect is appropriately suppressed.

In a manufacturing step of the power receiving coil 4, the coil 45 is formed by winding the litz wire 49 around the bobbin 7 serving as a coil mold. Thereafter, the coil 45 and the bobbin 7 are joined to the core 41, which is formed separately, in an integral manner. As a result of joining in an integral manner, the center leg section 43 of the core 41 is fitted into a hollow section at the center of the coil 45 and the center leg main partition section 71 of the bobbin 7. The side leg sections 44 of the core 41 cover, among an outer peripheral section of the coil 45, a partial range that is parallel to the movement direction of the moving body 99. The core 41 is not covered in, among the outer peripheral section of the coil 45, the remaining range that intersects the movement direction of the moving body 99. The bottom face section 42 of the core 41 covers an end face section on a side that is separated from the opposing intermediate face Sn of the coil 45. As a result of this, a magnetic shielding effect that suppresses leakage to the outside of a magnetic flux that reaches out from the power feeding coil 3 occurs. Accordingly, in the power receiving coil 4, loss due to leakage flux is also decreased.

Additionally, it is also possible to configure the coil 45 using three or more annular plate-shaped coil blocks. In this case, the numbers of the inter-block partition sections 73 and the coil accommodation spaces 75 are increased to correspond to the number of annular plate-shaped coil blocks.

4. Detailed Configuration of Power Receiving Coil 4A of Another Embodiment

Next, a detailed configuration of a power receiving coil 4A of another embodiment will be described focusing on the differences from the power receiving coil 4 already described. FIG. 10 is a cross-sectional view of the power receiving coil 4A of another embodiment. The power receiving coil 4A is provided with a core 41, a coil 45A, and a bobbin 7A. The core 41 shown in FIG. 10 has the same shape as the cores 41 shown in FIGS. 6 and 7.

The bobbin 7A is an integral product composed of a center leg main partition section 71, a bottom face main partition section 72, and four inter-block partition sections 76 to 79. The center leg main partition section 71 is a rectangular tubular shape that orbits the center leg section 43 of the core 41. The bottom face main partition section 72 is an annular plate-like site, is disposed at the periphery of the center leg main partition section 71, and is in contact with the bottom face section 42 of the core 41. The four inter-block partition sections 76 to 79 are rectangular tubular shape sites. The four inter-block partition sections 76 to 79 are disposed in the periphery of the center leg main partition section 71 separated from one another on the inside and the outside. One end in the axis line AX-direction of each of the inter-block partition sections 76 to 79 is linked to the bottom face main partition section 72.

A coil accommodation space 75A is defined between the center leg main partition section 71 and the inter-block partition section 76 furthest on the inside. Furthermore, coil accommodation spaces 75A are respectively defined between the inter-block partition sections 76 to 79. In total, four coil accommodation spaces 75A correspond to tubular empty spaces. The gap dimension G in a direction that intersects the axis line AX of the coil accommodation spaces 75A is set to be equivalent to the equivalent outer diameter dimension DL of the litz wire 49.

As shown in FIG. 10, the coil 45A is composed of four tubular coil blocks 455 to 458, which are aligned in the radial direction. Each tubular coil block 455 to 458 is respectively accommodated in a coil accommodation space 75A. The tubular coil blocks 455 to 458 are formed by winding a litz wire 49 around the axis line AX-direction two turns in the axis line AX direction. The number of winding turns of the litz wire 49 is not limited to two turns. In the present embodiment, the four tubular coil blocks 455 to 458 are electrically connected in series, but may be connected in parallel.

In this instance, since the gap dimension G of each coil accommodation space 75A is equivalent to the equivalent outer diameter dimension DL of the litz wire 49, shape loss does not occur in the litz wire 49 in coil work. Accordingly, in the power receiving coil 4A, in comparison with the use of a single wire having a large diameter, an effect of decreasing AC loss is significant when the litz wire 49 is used. In addition, the covering thickness Tb of the inter-block partition sections 76 to 78 is set so that the influence of a proximity effect that occurs at the specific frequency between portions of the litz wire 49 with the inter-block partition sections 76 to 78 interposed therebetween corresponds to a predetermined amount or less. As a result of this, in the power receiving coil 4A, the occurrence of AC loss caused by a proximity effect is also appropriately suppressed.

5. Aspects and Effects of Embodiment

The power feeding coil 3 is equivalent to an embodiment of a non-contact power feeding coil of the present disclosure. The power feeding coil 3 is a non-contact power feeding coil that configures the non-contact power feeding system 1 and is provided with the coil 35 through which an AC current of the specific frequency flows, and the core 31 that forms a section of a circulating magnetic path, which is interlinked with the coil 35, in the coil 35, the wire 36 having the insulating covering 38 is wound around the conductor 37, and the covering thickness Ti of the insulating covering 38 is set so that the influence of a proximity effect that occurs at the specific frequency between adjacent portions of the wire 36 is a predetermined amount or less.

In the power feeding coil 3, the covering thickness Ti of the insulating covering 38 of the wire 36 is set so as to ensure the insulating performance between portions of the conductor 37, and also so that the influence of a proximity effect is a predetermined amount or less. Therefore, it is possible to freely adjust a separation distance between portions of the conductor 37 by altering the covering thickness Ti; and therefore, the occurrence of AC loss caused by a proximity effect is appropriately suppressed. In addition, unlike the technique of PTL 2 in which gaps are provided between wires, portions of the wire 36 having the insulating covering 38 may be brought into contact with one another. Accordingly, dedicated designs are not required in the coil work for forming the coil 35, and there is no difficulty in the dimensional accuracy and work man-hours.

Furthermore, the cross-sectional area of the conductor 37 of the power feeding coil 3, or in other words, the diameter Dc of the circular cross-section of the conductor 37 is set on the basis of the coil resistance value R obtained by adding the DC resistance value Rdc of the coil 35, and the AC resistance value Rac of the coil 35, which is a resistance increment caused by a skin effect that occurs at the specific frequency. According to this configuration, an optimum cross-sectional area, or in other words, an optimum diameter Dc is set, and the occurrence of AC loss caused by a skin effect is suppressed. Moreover, since there is a saving in the amount of use of the wire 36, reductions in the weight and cost of the power feeding coil 3 are possible.

Furthermore, the conductor 37 of the power feeding coil 3 may be a composite conductor composed of a plurality of wires or a single conductor composed of a single wire. According to this configuration, since it is possible to select the type of the conductor 37 to match the power feeding capacity, difficulty of winding work, and the like, required in the power feeding coil 3, there is a large degree of design freedom.

Furthermore, in the coil 35 of the power feeding coil 3, the wire 36 is wound around, in a parallel manner, the opposing intermediate face Sn when a power feeding coil 3 and a power receiving coil 4 oppose one another, and the core 31 has the center leg section 33 that is fitted into a hollow section at the center of the coil 35, the side leg sections 34 that cover an outer peripheral section of the coil 35, and a bottom face section 32 that covers an end face section on a side that is separated from the opposing intermediate face Sn of the coil 35. According to this configuration, a magnetic shielding effect that suppresses leakage to the outside of a magnetic flux emitted from the power feeding coil 3 occurs, and loss due to leakage flux is decreased. In addition, unlike the magnetic body of PTL 3 and the non-magnetic conductive plate of PTL 4, the core 31 also serves as a magnetic shielding member. Accordingly, in comparison with the related art, reductions in the weight and cost of the power feeding coil 3 are possible.

Furthermore, the power feeding coils 3 are used in a manner of being aligned in a predetermined direction (the movement direction of the moving body 99), and the side leg sections 34 of the core 31 cover, among the outer peripheral section of the coil 35, a partial range that is parallel to the predetermined direction and do not cover a remaining range that intersects the predetermined direction. According to this configuration, since a sufficient magnetic shielding effect can be obtained even if the side leg sections, which cover the remaining range, are not provided, the shape of the core 31 is simplified, and therefore, reductions in the weight and cost thereof are possible.

In addition, a non-contact power feeding system 1 of the embodiment is a the non-contact power feeding system 1 provided with a power feeding coil provided in the power feeding unit is, the AC power supply circuit 2 that supplies AC power of the specific frequency to the power feeding coil, a power receiving coil 4 that is provided in the power receiving unit 1R, the power receiving coil electrically coupling with and receiving AC power in a non-contact manner when opposing the power feeding coil, and a power receiving circuit 5 that converts AC power received by the power receiving coil 4, generates a drive voltage, and outputs the drive voltage to the electrical load, the power feeding coil is the above-mentioned power feeding coil 3, and the power receiving coils 4 or 4A include the coil 45 or 45A through which an AC current of the specific frequency flows and the core 41 that forms a section of a circulating magnetic path, which is interlinked with the coil 45 or 45A, the coil 45 or 45A is composed of multiple coil blocks (annular plate-shaped coil blocks 453 and 454, or tubular coil blocks 455 to 458) in which the litz wire 49, which is configured by multiple wires 46 having insulating coverings 48 around conductors 47 are respectively wound, and further includes the bobbin 7 or 7A having the center leg main partition section 71 that partitions the coil 45 or 45A and the core 41, the bottom face main partition section 72, and the inter-block partition sections 73 or 76 to 78 that partition the multiple coil blocks.

According to this configuration, in the power feeding coil 3, the occurrence of AC loss is appropriately suppressed. Meanwhile, the power receiving coil 4 or 4A is provided with the coil 45 or 45A that is composed of the multiple coil blocks in which the litz wire 49 is respectively wound, and the bobbin 7 or 7A having the inter-block partition sections 73 or 76 to 78 that partition the multiple coil blocks. Therefore, the separation distance between portions of the litz wire 49 on both sides with the intersect-block partition sections 73 or 76 to 78 interposed therebetween are increased by the thickness Tb of the intersect-block partition sections 73 or 76 to 78, and the occurrence of AC loss caused by a proximity effect is suppressed. Accordingly, AC loss is decreased in both the power feeding coil 3 and the power receiving coil 4 or 4A, and favorable power feeding efficiency can be obtained in the non-contact power feeding system 1.

Furthermore, in the non-contact power feeding system 1 according to the embodiment, an identical number of the power feeding units is are provided in the multiple first to third board production machines 91 to 93 that configure a board production line 9, and the power receiving unit 1R is provided in the moving body 99 that moves in the linear arrangement direction of the multiple first to third board production machines 91 to 93.

According to this configuration, in all of the cases of alterations in the order of the linear arrangement positions of the board production machines 91 to 93, replacements with other modularized board production machines, and being made compatible with module expansion in which the number of linearly arranged machines increased, a favorable power receiving state is ensured in the non-contact power feeding system 1. Accordingly, when the line configuration of the board production line 9 is altered, or when the board production line 9 is made compatible with module expansion, the setup changing work for the non-contact power feeding system 1 is simple.

6. Applications and Modifications of Embodiments

Additionally, in the non-contact power feeding system 1 according to the embodiment, it is possible to dispose two power feeding-side coils 3 lined up in the movement direction of the front face in a board production machine having a large width dimension ML. Various other applications and modifications are also possible in the present disclosure.

INDUSTRIAL APPLICABILITY

The non-contact power feeding coil of the present disclosure can be applied to system configurations other than that of the non-contact power feeding system 1 of the embodiment. In addition, the non-contact power feeding system 1 of the embodiment is not limited to application to the board production line 9, and can be applied to a broad range of fields such as assembly lines and processing lines that produce other products, and power supply during travel of an electrically driven vehicle.

REFERENCE SIGNS LIST

1: non-contact power feeding system, 1S: power feeding unit, 1R: power receiving unit, 2: AC power supply circuit, 3: power feeding coil, 31: core, 32: bottom face section, 33: center leg section, 34: side leg section, 35: coil, 36: wire, 37: conductor, 38: insulating covering, 4, 4A: power receiving coil, 41: core, 42: bottom face section, 43: center leg section, 44: side leg section, 45, 45A: coil, 453, 454: annular plate-shaped coil blocks, 455 to 458: tubular coil blocks, 46: wire, 47: conductor, 48: insulating covering, 49: Litz wire, 5: power receiving circuit, 7, 7A: bobbin, 71: center leg main partition section, 72: bottom face main partition section, 73: inter-block partition section, 74: block end partition section, 75, 75A: coil accommodation space, 76 to 79: inter-block partition section, 9: board production line, 91 to 93: first to third board production machine, 99: moving body, EL: electrical load, Sn: opposing intermediate face, R: coil resistance value, Rdc: DC resistance value, Rac: AC resistance value

The invention claimed is:

1. A non-contact power feeding coil that is used in at least one of a power feeding coil and a power receiving coil that configure a non-contact power feeding system, the non-contact power feeding coil comprising:
a coil through which an AC current of a specific frequency flows; and
a core that forms a section of a circulating magnetic path, which is interlinked with the coil,
wherein in the coil, a wire having an insulating covering is wound around a conductor, and the wire is wound around, in a parallel manner, an opposing intermediate face when the power feeding coil and the power receiving coil oppose one another,
wherein the core has a center leg section that is fitted into a hollow section at the center of the coil, a side leg section that covers an outer peripheral section of the coil, and a bottom face section that covers an end face section on a side that is separated from the opposing intermediate face of the coil,
wherein a plurality of the coils for non-contact power supply are used in a manner of being aligned in a predetermined direction, and
wherein the side leg section of the core covers, among an outer peripheral section of the coil, a partial range that is parallel to the predetermined direction and does not cover a remaining range that intersects the predetermined direction.

2. The non-contact power feeding coil according to claim 1,
wherein a cross-sectional area of the conductor of the wire is based on a coil resistance value, the coil resistance value being obtained by adding a DC resistance value of the coil, and an AC resistance value of the coil which is a resistance increment caused by a skin effect that occurs at the specific frequency.

3. The non-contact power feeding coil according to claim 1,
wherein the conductor is a composite conductor composed of a plurality of wires, or a single conductor composed of a single wire.

4. A non-contact power feeding system comprising:
a power feeding coil provided in a power feeding unit;
an AC power supply circuit that supplies AC power of the specific frequency to the power feeding coil;
a power receiving coil that is provided in a power receiving unit, the power receiving coil electrically coupling with and receiving AC power in a non-contact manner when opposing the power feeding coil; and a power receiving circuit that converts AC power received by the power receiving coil, generates a drive voltage, and outputs the drive voltage to an electrical load, wherein the power feeding coil is the non-contact power feeding coil according to claim 1, and the power receiving coil includes a coil through which an AC current of the specific frequency flows and a core that forms a section of a circulating magnetic path, which is interlinked with the coil, the coil is composed of a plurality of coil blocks in which wires having insulating coverings around conductors are respectively wound, and further includes a bobbin having a main partition section that partitions the coil and the core, and an inter-block partition section that partitions the plurality of coil blocks.

5. The non-contact power feeding system according to claim 4, wherein an identical number of the power feeding units are provided in a plurality of board production machines that configure a board production line, and the power receiving unit is provided in a moving body that moves in a linear arrangement direction of the plurality of board production machines.

* * * * *